US012784795B2

(12) United States Patent
Nakayama et al.

(10) Patent No.: US 12,784,795 B2
(45) Date of Patent: Nov. 3, 2026

(54) MEMORY SYSTEM

(71) Applicant: Kioxia Corporation, Tokyo (JP)

(72) Inventors: Masahiko Nakayama, Yokohama Kawagawa (JP); Tatsuo Shiozawa, Setagaya Tokyo (JP)

(73) Assignee: Kioxia Corporation, Tokyo (JP)

( * ) Notice: Subject to any disclaimer, the term of this patent is extended or adjusted under 35 U.S.C. 154(b) by 155 days.

(21) Appl. No.: 18/746,057

(22) Filed: Jun. 18, 2024

(65) Prior Publication Data

US 2024/0428836 A1 Dec. 26, 2024

(30) Foreign Application Priority Data

Jun. 21, 2023 (JP) ................................ 2023-101715

(51) Int. Cl.
*G11C 11/16* (2006.01)
*H10B 61/00* (2023.01)

(52) U.S. Cl.
CPC ...... *G11C 11/1659* (2013.01); *G11C 11/1675* (2013.01); *H10B 61/10* (2023.02)

(58) Field of Classification Search
CPC ............ G11C 11/1659; G11C 11/1675; G11C 2213/15; G11C 7/04; G11C 11/161; G11C 11/1653; G11C 11/1693; G11C 13/0023; G11C 13/003; G11C 13/0069; G11C 11/4063; H10B 61/10
See application file for complete search history.

(56) References Cited

U.S. PATENT DOCUMENTS

| | | | | |
|---|---|---|---|---|
| 8,498,146 | B2 | 7/2013 | Sekar et al. | |
| 9,786,379 | B2 * | 10/2017 | Hsieh | G11C 16/349 |
| 11,062,770 | B2 | 7/2021 | Inaba et al. | |
| 2021/0407568 | A1 | 12/2021 | Kobayashi | |
| 2022/0284938 | A1 | 9/2022 | Aikawa | |
| 2022/0301621 | A1 | 9/2022 | Nakayama et al. | |
| 2023/0343385 | A1 * | 10/2023 | Yabe | G11C 11/4085 |

FOREIGN PATENT DOCUMENTS

| | | | |
|---|---|---|---|
| JP | 2012531004 | A | 12/2012 |
| JP | 2021047962 | A | 3/2021 |
| JP | 2022006539 | A | 1/2022 |
| TW | 202236143 | A | 9/2022 |
| WO | 2010147809 | A2 | 12/2010 |

* cited by examiner

*Primary Examiner* — Tuan D Nguyen
(74) *Attorney, Agent, or Firm* — Holtz, Holtz & Volek PC

(57) ABSTRACT

According to one embodiment, a memory system includes a memory unit including a memory cell array which includes a plurality of memory cells and which is divided into a plurality of memory cell blocks, and a drive circuit which drives the plurality of memory cells, and a controller which controls the memory unit. Each of the plurality of memory cells includes a resistance change memory element and a switching element connected in series to the resistance change memory element, and the controller is configured to control the memory unit in such a manner that the number of times of predetermined access to each of the plurality of memory cell blocks increases or decreases according to a distance from the drive circuit to each of the plurality of memory cell blocks.

11 Claims, 10 Drawing Sheets

MEMORY SYSTEM

CROSS-REFERENCE TO RELATED APPLICATIONS

This application is based upon and claims the benefit of priority from Japanese Patent Application No. 2023-101715, filed Jun. 21, 2023, the entire contents of which are incorporated herein by reference.

FIELD

Embodiments described herein relate generally to a memory system.

BACKGROUND

A memory system including a memory unit in which a memory cell array is included and controller configured to control the memory unit is proposed.

DETAILED DESCRIPTION

In general, according to one embodiment, a memory system includes: a memory unit including a memory cell array which includes a plurality of memory cells and which is divided into a plurality of memory cell blocks, and a drive circuit which drives the plurality of memory cells; and a controller which controls the memory unit, wherein each of the plurality of memory cells includes a resistance change memory element and a switching element connected in series to the resistance change memory element, and the controller is configured to control the memory unit in such a manner that the number of times of predetermined access to each of the plurality of memory cell blocks increases or decreases according to a distance from the drive circuit to each of the plurality of memory cell blocks.

Hereinafter the embodiments will be described with reference to the accompanying drawings.

First Embodiment

Figure 1:
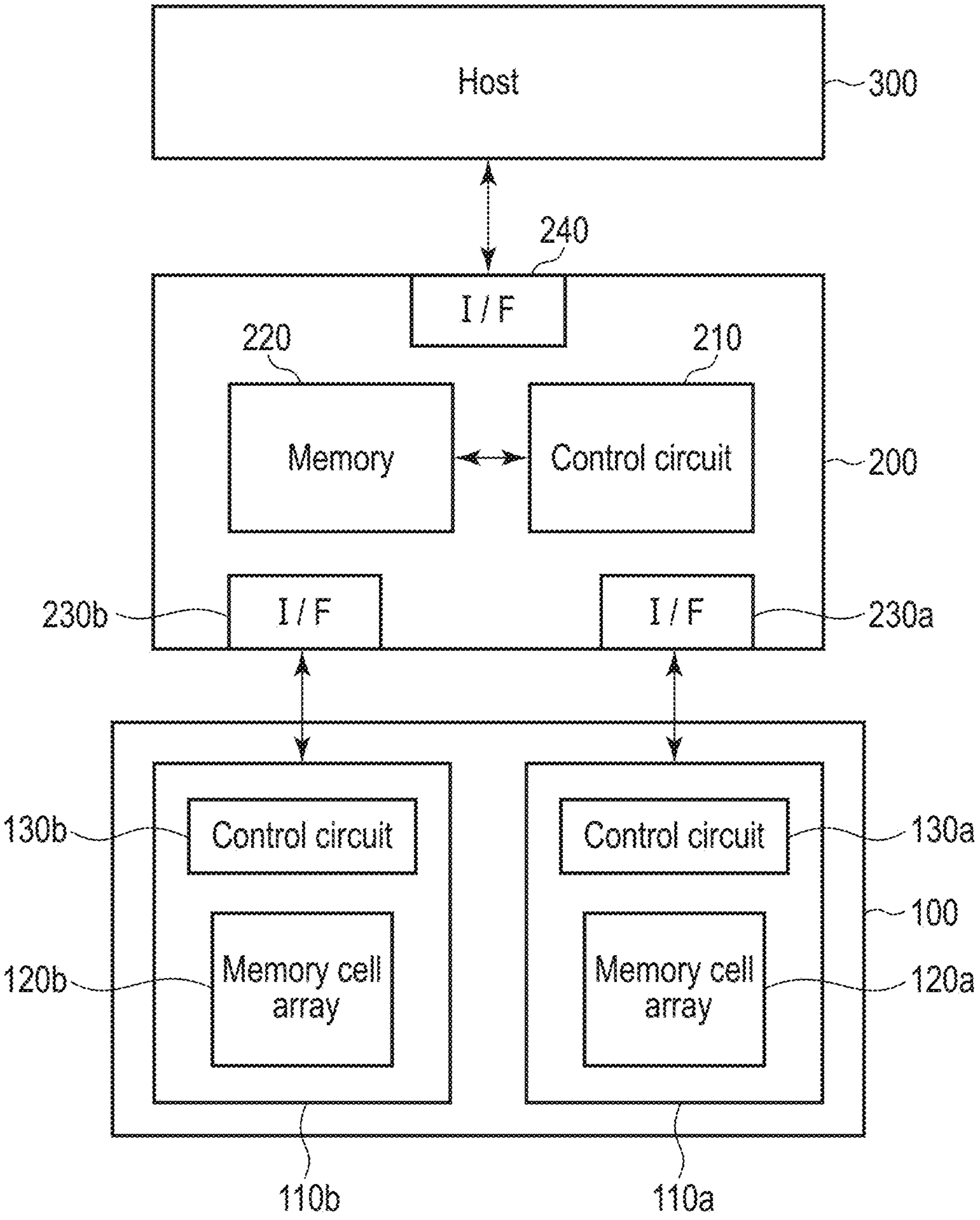
FIG. 1 is a block diagram showing the fundamental configuration of a memory system according to a first embodiment.

FIG. 1 is a block diagram showing the fundamental configuration of a memory system according to a first embodiment.

The memory system shown in FIG. 1 includes a memory unit 100 and controller 200 and the controller 200 is configured to enable connection of a host (host device) 300 thereto. The memory unit 100 and controller 200 may be provided in the same package or may be provided in separate packages.

The memory unit 100 includes one or more submemory units. In the example shown in FIG. 1, the memory unit 100 includes a submemory unit 110*a* and submemory unit 110*b*. The fundamental configurations of the submemory units 110*a* and 110*b* are identical to each other, and submemory units 110*a* and 110*b* respectively include memory cell arrays 120*a* and 120*b*, and control circuits 130*a* and 130*b*. The submemory unit 110*a* and submemory unit 110*b* may be provided in the same package or may be provided in separate packages.

It should be noted that in the following description, in some cases, each of the submemory units 110*a* and 110*b* is expressed as a submemory unit 110, each of the memory cell arrays 120*a* and 120*b* is expressed as a memory cell array 120, and each of the control circuits 130*a* and 130*b* is expressed as a control circuit 130.

Figure 2:
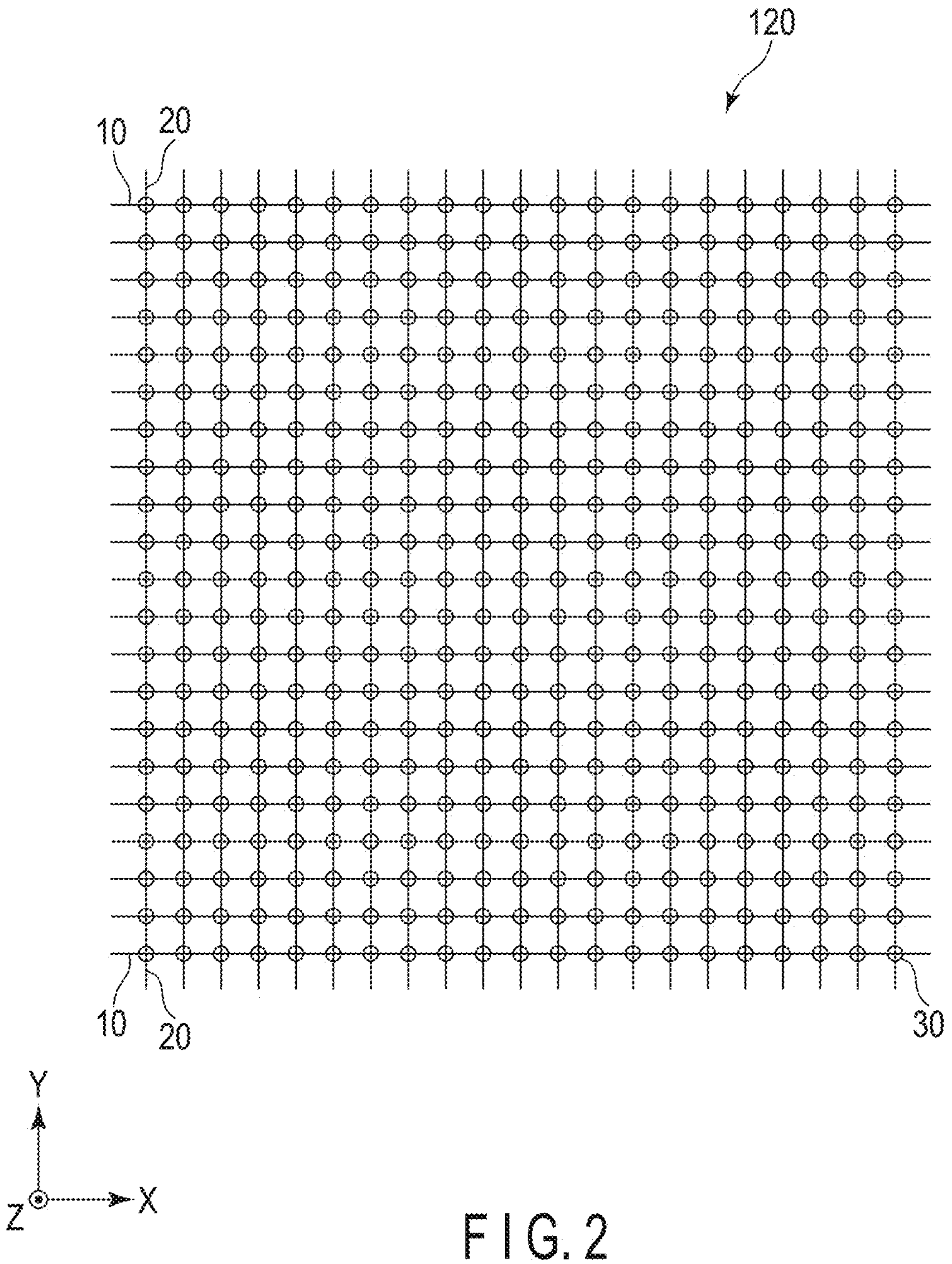
FIG. 2 is a view schematically showing the overall configuration of an area according to the first embodiment in which a memory cell array is provided.
Figure 3:
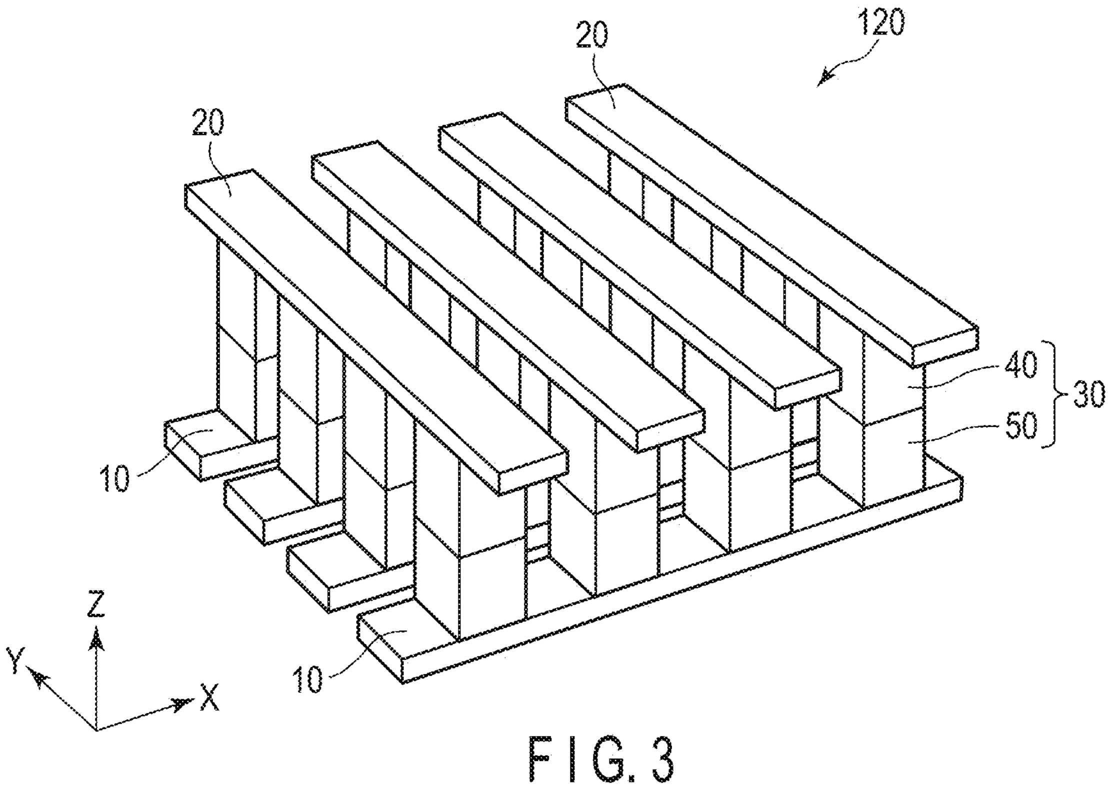
FIG. 3 is a perspective view schematically showing the partial configuration of the area according to the first embodiment in which the memory cell array is provided.

FIG. 2 is a view schematically showing the overall configuration of an area in which the memory cell array 120 is provided. FIG. 3 is a perspective view schematically showing the partial configuration of the area in which the memory cell array 120 is provided.

It should be noted that the X-direction, Y-direction, and Z-direction shown in FIG. 2 and FIG. 3 are directions intersecting each other. More specifically, the X-direction, Y-direction, and Z-direction intersect each other at right angles.

As shown in FIG. 2, a plurality of memory cells 30 are arranged in such a manner as to correspond to positions at which a plurality of wiring lines 10 each extending in the X-direction and a plurality of wiring lines 20 each extending in the Y-direction intersect each other. That is, the plurality of memory cells 30 included in the memory cell array 120 are arranged in a matrix state in the X-direction and Y-direction. One of the wiring line 10 and wiring line 20 corresponds to a word line, and the other of the wiring line 10 and wiring line 20 corresponds to a bit line.

More specifically, as shown in FIG. 3, between the plurality of wiring lines 10 and plurality of wiring lines 20, the plurality of memory cells 30 are provided. Each of the memory cells 30 includes a magnetoresistance effect element (resistance change memory element) 40 and selector (switching element) 50 connected in series to the magnetoresistance effect element 40. The magnetoresistance effect element 40 and selector 50 included in the memory cell 30 are stacked in the Z-direction.

It should be noted that although in the example shown in FIG. 3, the magnetoresistance effect element 40 is provided on the upper layer side of the selector 50, the magnetoresistance effect element 40 may also be provided on the lower layer side of the selector 50.

Figure 4:
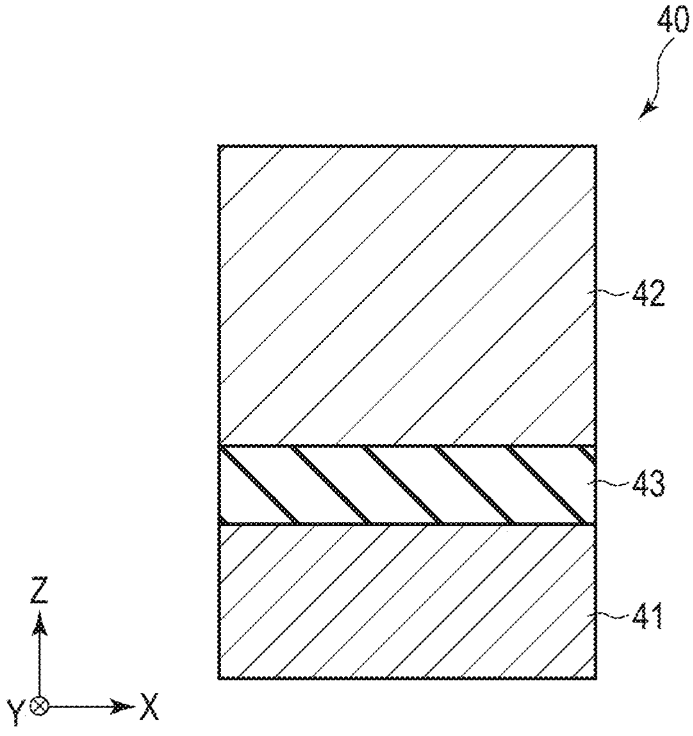
FIG. 4 is a cross-sectional view schematically showing the configuration of a magnetoresistance effect element according to the first embodiment.

FIG. 4 is a cross-sectional view schematically showing the configuration of the magnetoresistance effect element 40.

The magnetoresistance effect element 40 is a magnetic tunnel junction (MTJ) element and is a nonvolatile memory element. The magnetoresistance effect element 40 has a configuration in which a storage layer (first magnetic layer) 41, reference layer (second magnetic layer) 42, and tunnel barrier layer (nonmagnetic layer) 43 are stacked in the Z-direction.

The storage layer 41 is a ferromagnetic layer having the variable magnetization direction and is constituted of, for example, a CoFeB layer containing therein cobalt (Co), iron (Fe), and boron (B). The variable magnetization direction implies that the magnetization direction is changed by a predetermined write current.

The reference layer 42 is a ferromagnetic layer having the fixed magnetization direction. The reference layer 42 has a configuration in which for example, a CoFeB layer containing therein cobalt (Co), iron (Fe), and boron (B), and superlattice layer of cobalt (Co) and platinum (Pt) are stacked. The fixed magnetization direction implies that the magnetization direction is not changed by the predetermined write current.

The tunnel barrier layer 43 is an insulating layer provided between the storage layer 41 and reference layer 42 and is constituted of, for example, a MgO layer containing therein magnesium (Mg) and oxygen (O).

When the magnetization direction of the storage layer 41 is parallel to the magnetization direction of the reference layer 42, the magnetoresistance effect element 40 is in a low-resistance state in which the resistance thereof is relatively low. When the magnetization direction of the storage layer 41 is antiparallel to the magnetization direction of the reference layer 42, the magnetoresistance effect element 40 is in a high-resistance state in which the resistance thereof is relatively high. Accordingly, the magnetoresistance effect element 40 can store therein binary data according to the resistance state thereof in a nonvolatile manner. Further, it is possible to set one of the low-resistance state and high-resistance state to the magnetoresistance effect element 40 according to the direction in which the write current flows.

The magnetoresistance effect element 40 is a spin transfer torque (STT) magnetoresistance effect element and has perpendicular magnetization. That is, the magnetization direction of the storage layer 41 is perpendicular to the film surface thereof, and magnetization direction of the reference layer 42 is perpendicular to the film surface thereof.

It should be noted that although in FIG. 4, an example of a bottom-free magnetoresistance effect element in which the storage layer 41 is positioned on the lower layer side of the reference layer 42 is shown, a top-free magnetoresistance effect element in which the storage layer 41 is positioned on the upper layer side of the reference layer 42 may also be used.

Figure 5:
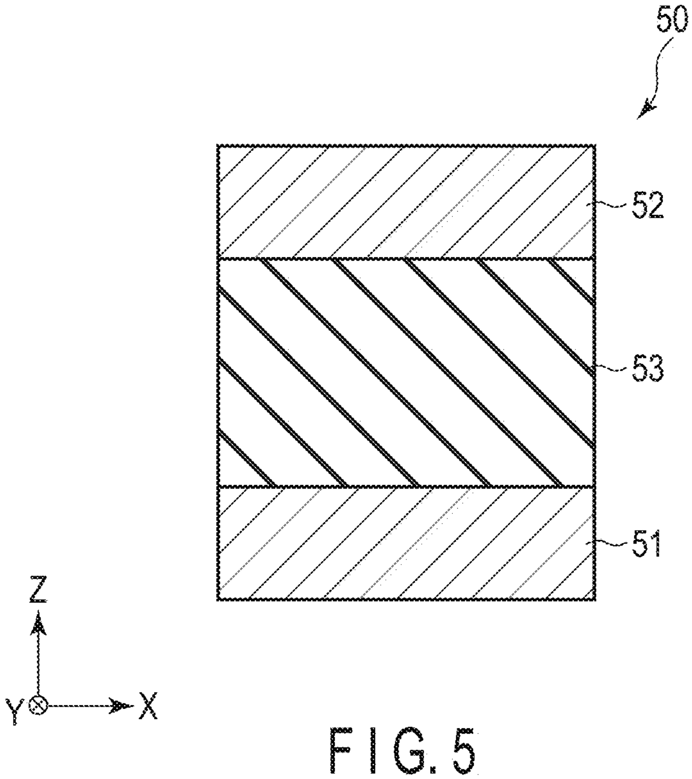
FIG. 5 is a cross-sectional view schematically showing the configuration of a selector according to the first embodiment.

FIG. 5 is a cross-sectional view schematically showing the configuration of the selector 50.

The selector 50 is a two-terminal switching element and has a configuration in which a first electrode 51, second electrode 52, and selector material layer (switching material layer) 53 are stacked in the Z-direction. The selector material layer 53 is formed of, for example, a material in which a metallic element (for example, arsenic) is added to an insulating material (for example, silicon oxide).

Figure 6:
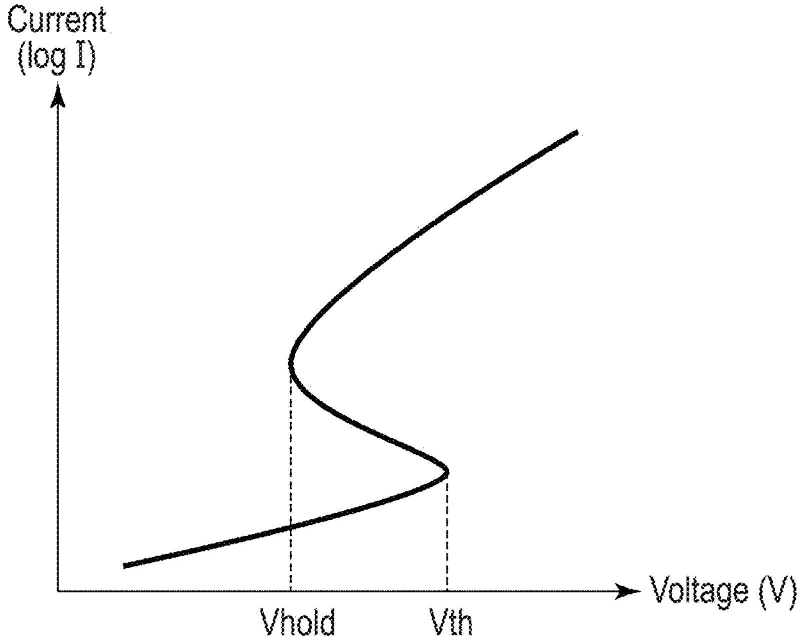
FIG. 6 is a view schematically showing the current-voltage characteristics of the selector according to the first embodiment.

FIG. 6 is a view schematically showing the current-voltage characteristics of the selector 50. The axis of abscissa indicates a voltage to be applied between the two terminals of the selector 50 and axis of ordinate indicates a current flowing from one of the two terminals of the selector to the other.

As shown in FIG. 6, the selector 50 has such characteristics that when the voltage applied between the two terminals thereof increases to reach the threshold voltage Vth, the selector 50 makes a transition from the off-state to the on-state and, when the voltage applied between the two terminals thereof decreases to reach the hold voltage Vhold, the selector 50 makes a transition from the on-state to the off-state.

When a voltage is applied between the wiring line 10 and wiring line 20 shown in FIG. 3 and, when the voltage applied to the selector 50 reaches the threshold voltage Vth, the selector 50 enters the on-state and a current flows through the magnetoresistance effect element 40 connected in series to the selector 50. Thereby, it becomes possible to carry out write or read to or from the magnetoresistance effect element 40.

The description is returned to the description of FIG. 1. The control circuit 130 (130*a*, 130*b*) is a control circuit configured to control the memory cell array 120 (120*a*, 120*b*) on the basis of a command from the controller 200. The control circuit 130 includes a drive circuit and the like configured to drive the memory cells 30 included in the memory cell array 120. Further, when a logical address is transmitted from the controller 200 to the memory unit 100, the control circuit 130 may include a function of converting the logical address to the physical address.

The controller 200 is a controller configured to control the memory unit 100 on the basis of a command from the host 300 and includes a control circuit 210 and memory 220. The control circuit 210 includes a central processing unit (CPU) and the like and memory 220 includes a dynamic random access memory (DRAM) and the like.

Further, the controller 200 includes interfaces (I/Fs) 230*a*, 230*b*, and 240. Transmission/reception of information is carried out between the controller 200 and memory unit 100 through the interfaces 230*a* and 230*b*, and transmission/reception of information is carried out between the controller 200 and host 300 through the interface 240.

Figure 7:
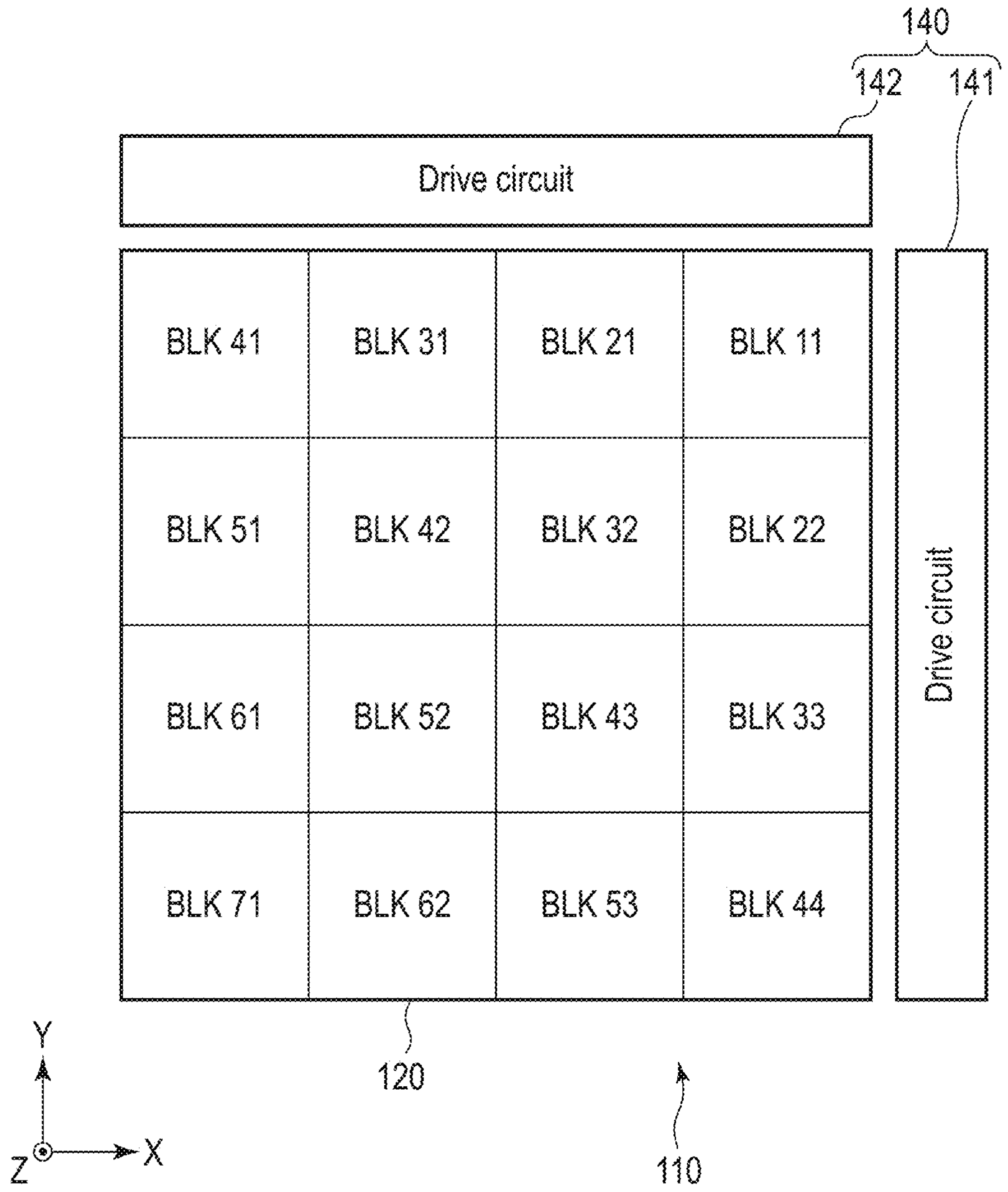
FIG. 7 is a view schematically showing the configuration of a submemory unit according to the first embodiment.

FIG. 7 is a view schematically showing the configuration of the submemory unit 110.

A drive circuit 141 and drive circuit 142 are included in the control circuits 130 (130*a* and 130*b*) shown in FIG. 1 and are drive circuits configured to drive the plurality of memory cells 30 shown in FIG. 2 and FIG. 3. The drive circuit 141 is provided along an end of the memory cell array 120 in the X-direction and is connected to the plurality of wiring lines 10 shown in FIG. 2 and FIG. 3. The drive circuit 142 is provided along an end of the memory cell array 120 in the Y-direction and is connected to the plurality of wiring lines 20 shown in FIG. 2 and FIG. 3. It should be noted that in the following description, in some cases, each of the drive circuit 141 and drive circuit 142 is also expressed as a drive circuit 140.

In the memory cell array 120, the plurality of memory cells 30 are included and memory cell array 120 is divided into a plurality of memory cell blocks. In the example shown in FIG. 7, the memory cell array 120 is divided into 16 memory cell blocks BLK (BLK11 to BLK71) in a matrix state and each memory cell block BLK has a rectangular shape. Hereinafter, a description of the above will be given.

As already described, when the voltage applied to the selector 50 reaches the threshold voltage Vth, the selector 50 enters the on-state and a current flows through the magnetoresistance effect element 40 connected in series to the selector 50. That is, a current flows through the memory cell 30 and it becomes possible to carry out write or read to or from the magnetoresistance effect element 40.

When the selector 50 makes a transition from the off-state to the on-state, a spike current flows through the memory cell 30 and spike voltage is applied to the memory cell 30. For this reason, there is a possibility of deterioration of the memory cell 30 ascribable to a breakdown or the like of the tunnel barrier layer 43 or problem of read disturb or the like occurring. As a result, there is a possibility of the characteristics and reliability of the memory cell 30 being deteriorated.

The magnitude of the spike current (spike voltage) is dependent on the parasitic capacitance and parasitic resistance incidental to the memory cell 30. As the primary factors of the parasitic capacitance and parasitic resistance, the wiring lines (wiring line 10 and wiring line 20) connected to the memory cell 30 and global wiring lines (global word lines and global bit lines) in the drive circuits 140 (drive circuit 141 and drive circuit 142) are conceivable.

When the global wiring lines are thick, the influence of the parasitic capacitance and parasitic resistance of the global wiring lines becomes greater than the influence of the parasitic capacitance and parasitic resistance of the wiring line 10 and wiring line 20. For this reason, the spike current (spike voltage) becomes greater in the memory cells 30 closer to the drive circuit 140 than in the memory cells 30 farther away from the drive circuit 140. Conversely, when the global wiring lines are thin, the spike current (spike voltage) becomes greater in the memory cells 30 farther away from the drive circuit 140 than in the memory cells 30 closer to the drive circuit 140.

Thus in this embodiment, the memory unit 100 is controlled in such a manner that the number of times of access to each of the memory cells 30 in which a large spike current (spike voltage) occurs becomes relatively smaller. Thereby, when viewed as a whole, in the memory unit 100, it is possible to uniformize the degrees of deterioration of the memory cells 30 and prolong the lifetime of the entirety of the memory unit 100.

For example, when the spike current (spike voltage) is greater in the memory cells 30 closer to the drive circuit 140 than in the memory cells 30 farther away from the drive circuit 140, control is carried out in such a manner that the number of times of access to each of the memory cells 30 closer to the drive circuit 140 becomes relatively smaller. Conversely, when the spike current (spike voltage) is greater in the memory cells farther away from the drive circuit 140 than in the memory cells 30 closer to the drive circuit 140, control is carried out in such a manner that the number of times of access to each of the memory cells 30 farther away from the drive circuit 140 becomes relatively smaller.

In order to carry out the control described above, in this embodiment, the memory cell array 120 is divided into a plurality of memory cell blocks BLK according to the distances from the drive circuit 140 to the plurality of memory cell blocks BLK (BLK11 to BLK71).

In the example shown in FIG. 7, the distance from the drive circuit 140 corresponds to the total distance (D1+D2) of the distance D1 from the drive circuit 141 and distance D2 from the drive circuit 142. For example, the distance D1 from the drive circuit 141 corresponds to the distance from the drive circuit 141 to the central position of each memory cell block BLK and distance D2 from the drive circuit 142 corresponds to the distance from the drive circuit 142 to the central position of each memory cell block BLK.

The total distance (D1+D2) is minimized in the memory cell block BLK11 and is maximized in the memory cell block BLK71. Further, the memory cell blocks BLK21 and BLK22 belong to a group of the same total distance, memory cell blocks BLK31 to BLK33 belong to a group of the same total distance, memory cell blocks BLK41 to BLK44 belong to a group of the same total distance, memory cell blocks BLK51 to BLK53 belong to a group of the same total distance, and memory cell blocks BLK61 and BLK62 belong to a group of the same total distance.

Figure 8:
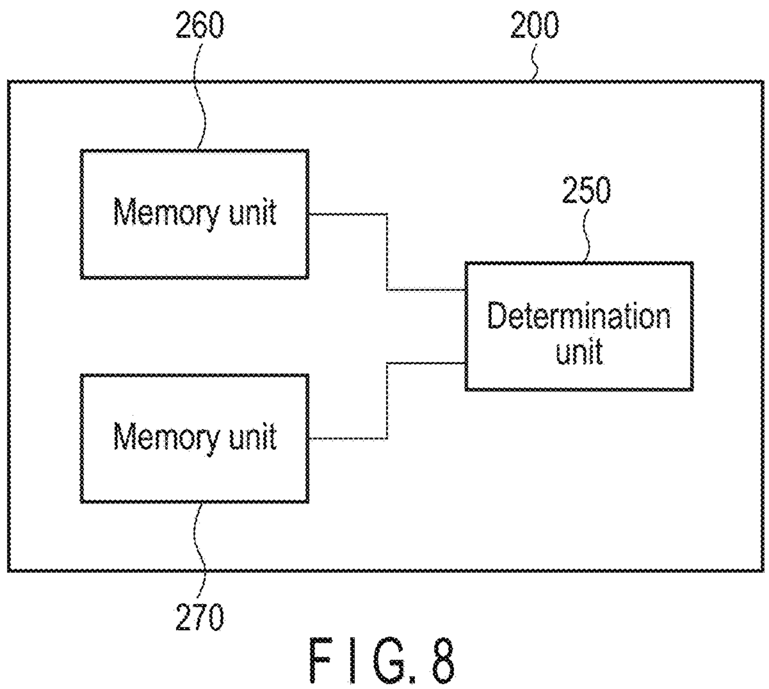
FIG. 8 is a functional block diagram showing the functional configuration of a controller according to the first embodiment.
Figure 9:
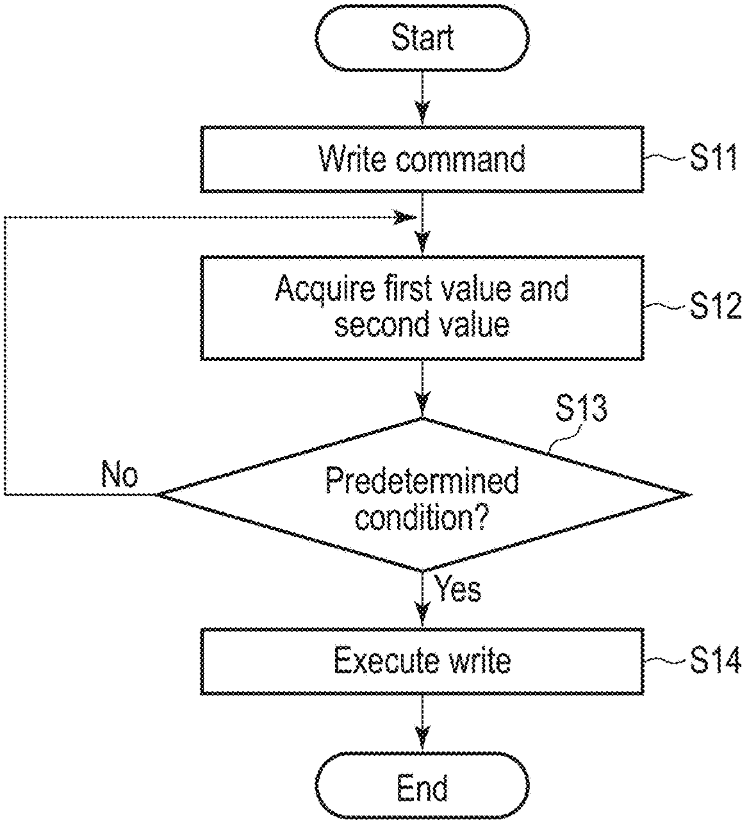
FIG. 9 is a flowchart showing the operation of the memory system according to the first embodiment.

FIG. 8 is a functional block diagram showing the functional configuration of the controller 200 configured to carry out the control described above.

The controller includes a determination unit 250, memory unit 260, and memory unit 270. The determination unit 250 corresponds mainly to the control circuit 210 of FIG. 1. The memory unit 260 and memory unit 270 correspond mainly to the memory 220 of FIG. 1.

The memory unit 260 stores therein, with respect to each of the plurality of memory cell blocks BLK of each of the one or more memory cell arrays 120, a first value based on the number of times of predetermined access actually made to each of the plurality of memory cell blocks BLK. In the example of FIG. 1 and FIG. 7, with respect to each of the plurality of memory cell blocks BLK (BLK11 to BLK71) included in each of the memory cell arrays 120*a* and 120*b*, the first value based on the number of times of the predetermined access made to each of the plurality of memory cell blocks BLK (BLK11 to BLK71) is stored (in the memory unit 260). More specifically, the memory unit 260 has a function of a counter configured to count the number of times of the predetermined access.

The predetermined access corresponds to at least one of write access (access configured to write data to the memory cell 30) and read access (access configured to read data from the memory cell 30). That is, the number of times of the predetermined access may be the total number of times of the number of times of the write access and number of times of the read access, may be the number of times of only the write access, or may be the number of times of only the read access.

The first value increases when the number of times of the predetermined access increases. For example, the first value may be the value of the number of times itself of the predetermined access or may be the value correlated with the number of times of the predetermined access.

The memory unit 270 stores therein, with respect to each of the plurality of memory cell blocks BLK of each of the one or more memory cell arrays 120, a second value based on the allowable number of times of the predetermined access to each of the plurality of memory cell blocks BLK. In the example of FIG. 1 and FIG. 7, with respect to each of the plurality of memory cell blocks BLK (BLK11 to BLK71) included in each of the memory cell arrays 120*a* and 120*b*, the second value based on the allowable number of times of the predetermined access to each of the plurality of memory cell blocks BLK (BLK11 to BLK71) is stored (in the memory unit 270).

As can be seen from the description already given above, the degree of deterioration of the memory cell 30 is dependent on the number of times of access to the memory cell 30 and distance from the drive circuit 140. Accordingly, the allowable number of times of access to the memory cell 30 changes according to the distance from the drive circuit 140. For example, the allowable number of times of access corresponds to the upper limit of the number of times of access and access is disabled with respect to a memory cell 30 which has reached the allowable number of times of access.

On the basis of the items described above, the second value is stored in the memory unit 270 in such a manner that the allowable number of times of the predetermined access to each of the plurality of memory cell blocks BLK (BLK11 to BLK71) increases or decreases according to the distance from the drive circuit 140. The second value increases when the allowable number of times of the predetermined access increases. For example, the second value may be the value of the allowable number of times itself of the predetermined access or may be the value correlated with the allowable number of times of the predetermined access. The second value also increases or decreases according to the distance from the drive circuit 140 as in the case of the allowable number of times of the predetermined access. Normally, regarding the memory cell blocks BLK of the same total distance (D1+D2), the second values of these memory cell blocks BLK are identical to each other. That is, regarding the memory cell blocks BLK belonging to the same group, the second values of the memory cell blocks BLK are identical to each other.

The determination unit 250 determines, on the basis of the first value stored in the memory unit 260 and second value stored in the memory unit 270, a memory cell block BLK to which data should be written out of the plurality of memory cell blocks BLK included in one of the one or more memory cell arrays 120. In the example of FIG. 1 and FIG. 7, the determination unit 250 determines a memory cell block BLK to which data should be written out of the plurality of memory cell blocks BLK (BLK11 to BLK71) included in one of the memory cell arrays 120*a* and 120*b*.

As already described above, the memory unit 260 and memory unit 270 correspond mainly to the memory 220 of FIG. 1. As the memory 220, normally a volatile memory such as a DRAM or the like is used, and hence when the power source of the controller 200 enters the off-state, the first value and second value respectively stored in the memory unit 260 and memory unit 270 do not remain in the memory unit 260 and memory unit 270. For this reason, when the power source of the controller 200 makes a transition from the on-state to the off-state, the first value and second value respectively stored in the memory unit 260 and memory unit 270 are saved in the submemory unit 110 (110*a*, 110*b*) of FIG. 1 or in the host 300. When the power source of the controller 200 makes a transition from the off-state to the on-state, the first value and second value stored in the submemory unit 110 or in the host 300 are respectively set to the memory unit 260 and memory unit 270.

Next, the operation of the memory system according to this embodiment will be described below with reference to the flowchart shown in FIG. 9, and FIG. 1, FIG. 7, and FIG. 8.

When a write command is transmitted from the host 300 (S11), the controller 200 carries out the following operation.

First, the controller 200 temporarily selects one memory cell block BLK from among the plurality of memory cell blocks BLK included in the memory cell arrays 120*a* and 120*b* and, with respect to the temporarily selected memory cell block BLK, acquires the first value stored in the memory unit 260 and second value stored in the memory unit 270 (S12).

The determination unit 250 determines, on the basis of the first value and second value, whether or not the temporarily selected memory cell block BLK satisfies the predetermined condition (S13). For example, assuming that the first value is the number of times of the predetermined access and second value is the allowable number of times of the predetermined access, the determination unit 250 determines, with respect to the temporarily selected memory cell block BLK, whether or not the first value is less than the second value.

When the predetermined condition is satisfied (when the first value is less than the second value), the temporarily selected memory cell block BLK is selected (determined) as the memory cell block BLK to which data should be written, and write of data to the selected memory cell block BLK is executed (S14).

When the first value is greater than or equal to the second value, a different memory cell block BLK is temporarily selected and steps of S12 and S13 are carried out on the different memory cell block BLK. In this manner, the steps of S12 and S13 are carried out until the predetermined condition is satisfied and write of data to the memory cell block BLK satisfying the predetermined condition is executed (S14).

As described above, in this embodiment, with respect to each of the plurality of memory cell blocks BLK of each of the one or more memory cell arrays 120, the first value based on the number of times of the predetermined access and second value based on the allowable number of times of the predetermined access are stored, and the memory cell block BLK to which data should be written is determined on the basis of the first value and second value.

Accordingly, by setting the second value in advance according to the position of the memory cell block BLK, it is possible, even when the dimensions of the influence of the spike current (spike voltage) occurring at the time of access to the memory cell 30 differ according to the position of the memory cell 30 in the memory cell array 120, to uniformize the degrees of deterioration of the plurality of memory cells 30 included in the memory unit 100 and prolong the lifetime of the entirety of the memory unit 100.

In particular, when the dimensions of the influence of the spike current (spike voltage) increase or decrease according to the distance from the drive circuit 140, by setting the second value in advance with respect to each of the plurality of memory cell blocks BLK in such a manner that the allowable number of times of the predetermined access increases or decreases according to the distance from the drive circuit 140, it is possible to securely uniformize the degrees of deterioration of the plurality of memory cells 30 included in the memory unit 100.

By setting the second value in advance in the manner described above, it is possible for the controller 200 to control the memory unit 100 in such a manner that the number of times of the predetermined access to each of the plurality of memory cell blocks BLK increases or decreases according to the distance from the drive circuit 140 to each of the plurality of memory cell blocks BLK. For example, on the basis of the first value acquired from the memory unit 260 and second value acquired from the memory unit 270, the determination unit 250 selects (determines) a memory cell block BLK in which a difference between the first value and second value is the largest, whereby it is possible to effectively carry out the control described above.

As can be seen from the description given above, in this embodiment, control is not carried out in such a manner that the numbers of times of the predetermined access are uniformized with respect to the plurality of memory cell blocks BLK unlike in the general wear leveling, and control is carried out in such a manner that the number of times of the predetermined access to each of the plurality of memory cell blocks BLK has a gradient according the distance from the drive circuit 140 in consideration of the fact that the spike currents (spike voltages) differ among the plurality of memory cell blocks BLK. By the control described above, it is possible to uniformize the degrees of deterioration of the memory cells 30 with respect to the plurality of memory cell blocks BLK.

Figure 10:
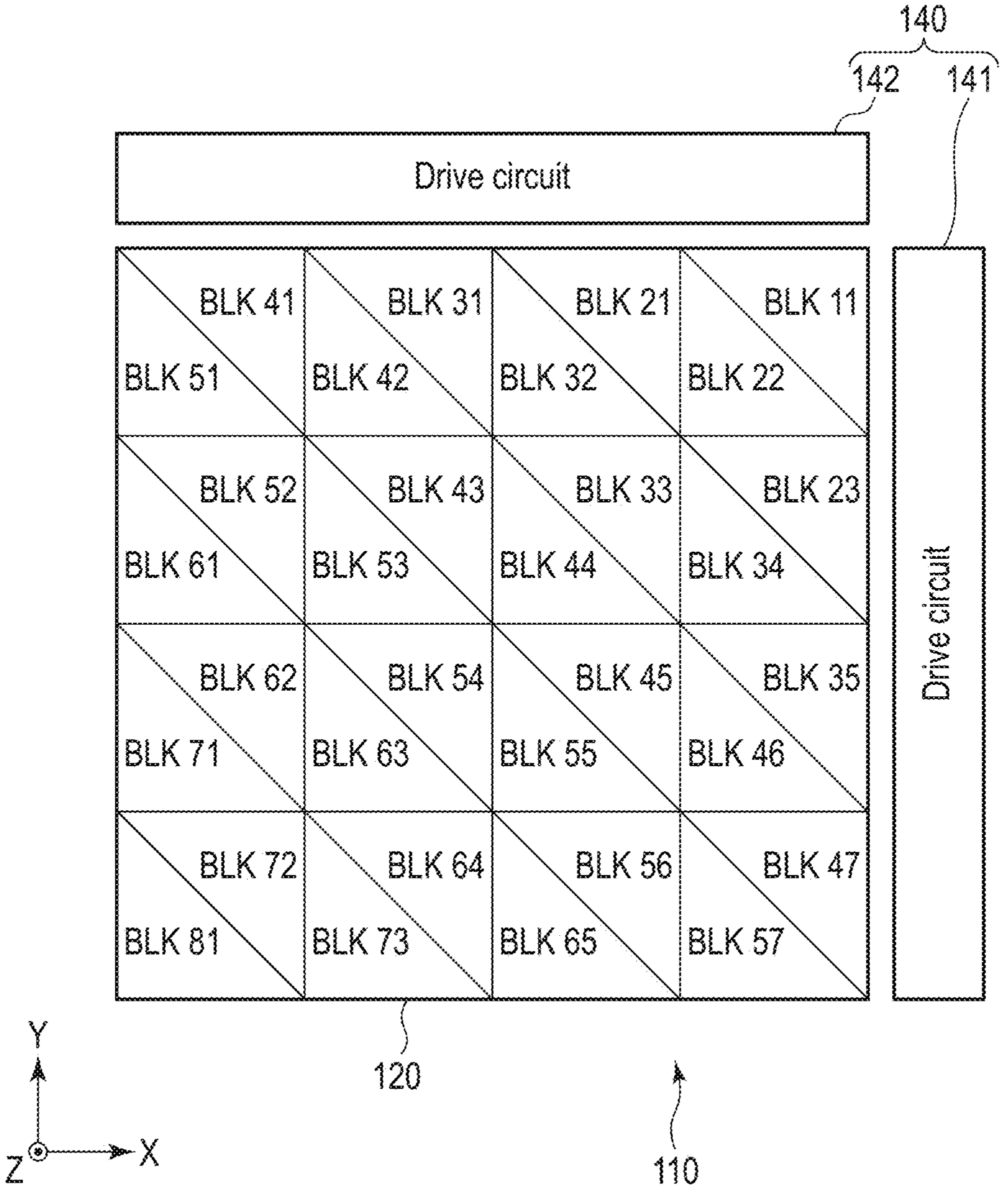
FIG. 10 is a view schematically showing the configuration of a submemory unit according to a first modified example of the first embodiment.

FIG. 10 shows a first modified example of the memory system according to this embodiment and is a view schematically showing the configuration of the submemory unit 110.

Although in the example shown in FIG. 7, the shape of each memory cell block BLK is rectangular, in this modified example, the shape of each memory cell block BLK is a triangular shape formed by dividing a rectangular shape into two equal parts. In this modified example too, as in the case of the example shown in FIG. 7, one group is constituted of memory cell blocks BLK each having the same total distance (D1+D2) of the distance D1 from the drive circuit 141 and distance D2 from the drive circuit 142.

The total distance (D1+D2) is minimized in the memory cell block BLK11 and is maximized in the memory cell block BLK81. Further, the memory cell blocks BLK21 to BLK23 belong to a group of the same total distance, memory cell blocks BLK31 to BLK35 belong to a group of the same total distance, memory cell blocks BLK41 to BLK47 belong to a group of the same total distance, memory cell blocks BLK51 to BLK57 belong to a group of the same total distance, memory cell blocks BLK61 to BLK65 belong to a group of the same total distance, and memory cell blocks BLK71 to BLK73 belong to a group of the same total distance.

In this modified example, the memory cell blocks BLK are further segmentalized according to the distances from the drive circuit 140, and hence it is possible to exhibit the effect of the embodiment described above in a more effective manner.

Figure 11:
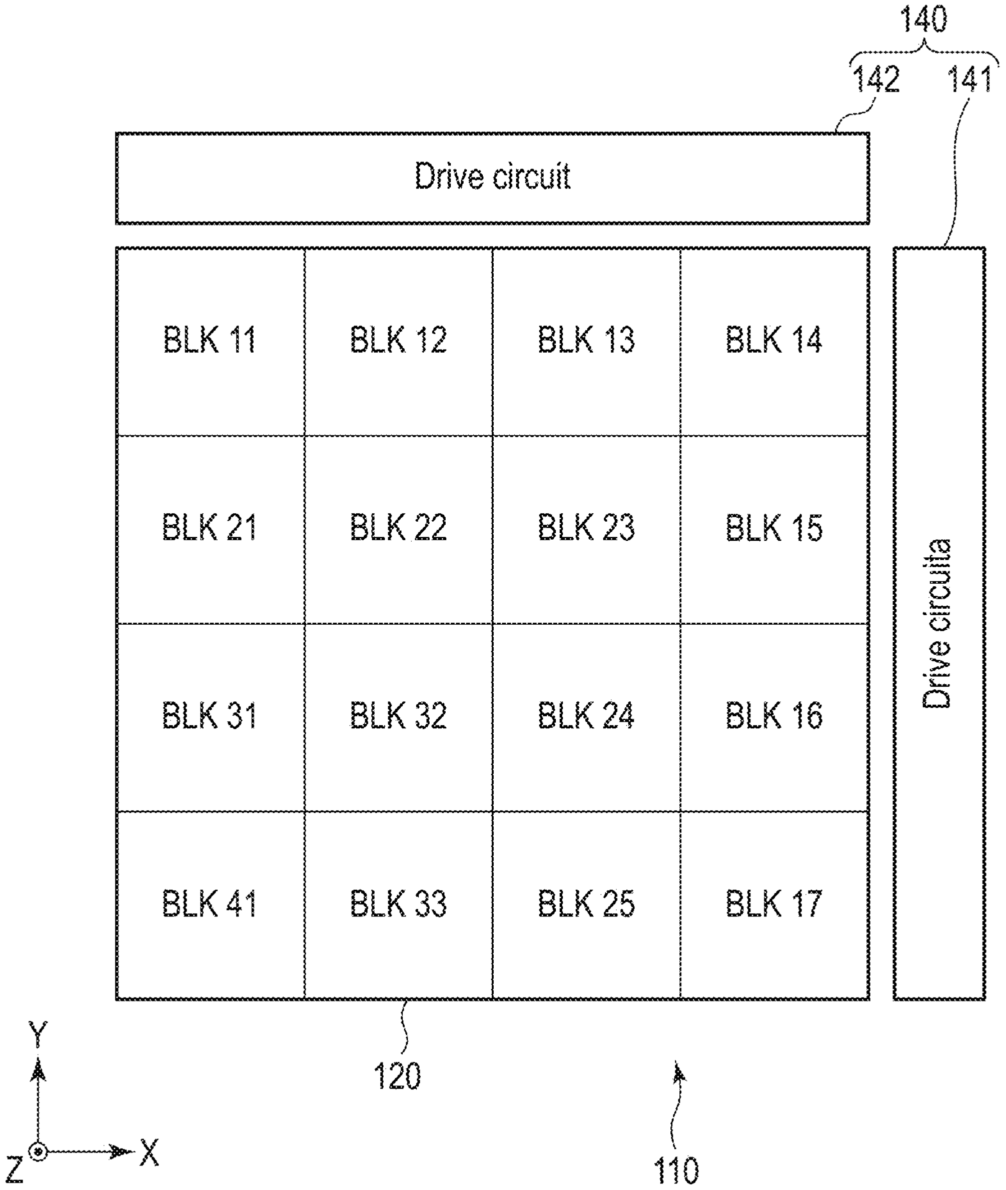
FIG. 11 is a view schematically showing the configuration of a submemory unit according to a second modified example of the first embodiment.

FIG. 11 shows a second modified example of the memory system according to this embodiment and is a view schematically showing the configuration of the submemory unit 110.

Although in the example shown in FIG. 7, the distance from the drive circuit 140 corresponds to the total distance (D1+D2) of the distance D1 from the drive circuit 141 and distance D2 from the drive circuit 142, in this modified example, the distance from the drive circuit 140 corresponds to the distance DS which is the shorter of the distance D1 from the drive circuit 141 and distance D2 from the drive circuit 142.

In the example of FIG. 11, the memory cell blocks BLK11 to BLK17 belong to a group of the same distance DS, memory cell blocks BLK21 to BLK25 belong to a group of the same distance DS, memory cell blocks BK31 to BLK33 belong to a group of the same distance DS, and memory cell block BLK41 belongs to another group.

In this modified example too, it is possible to obtain the effect identical to the embodiment described above.

Second Embodiment

Next, a second embodiment will be described. It should be noted that the fundamental items are identical to the first embodiment and descriptions of the items described in the first embodiment are omitted.

Figure 12:
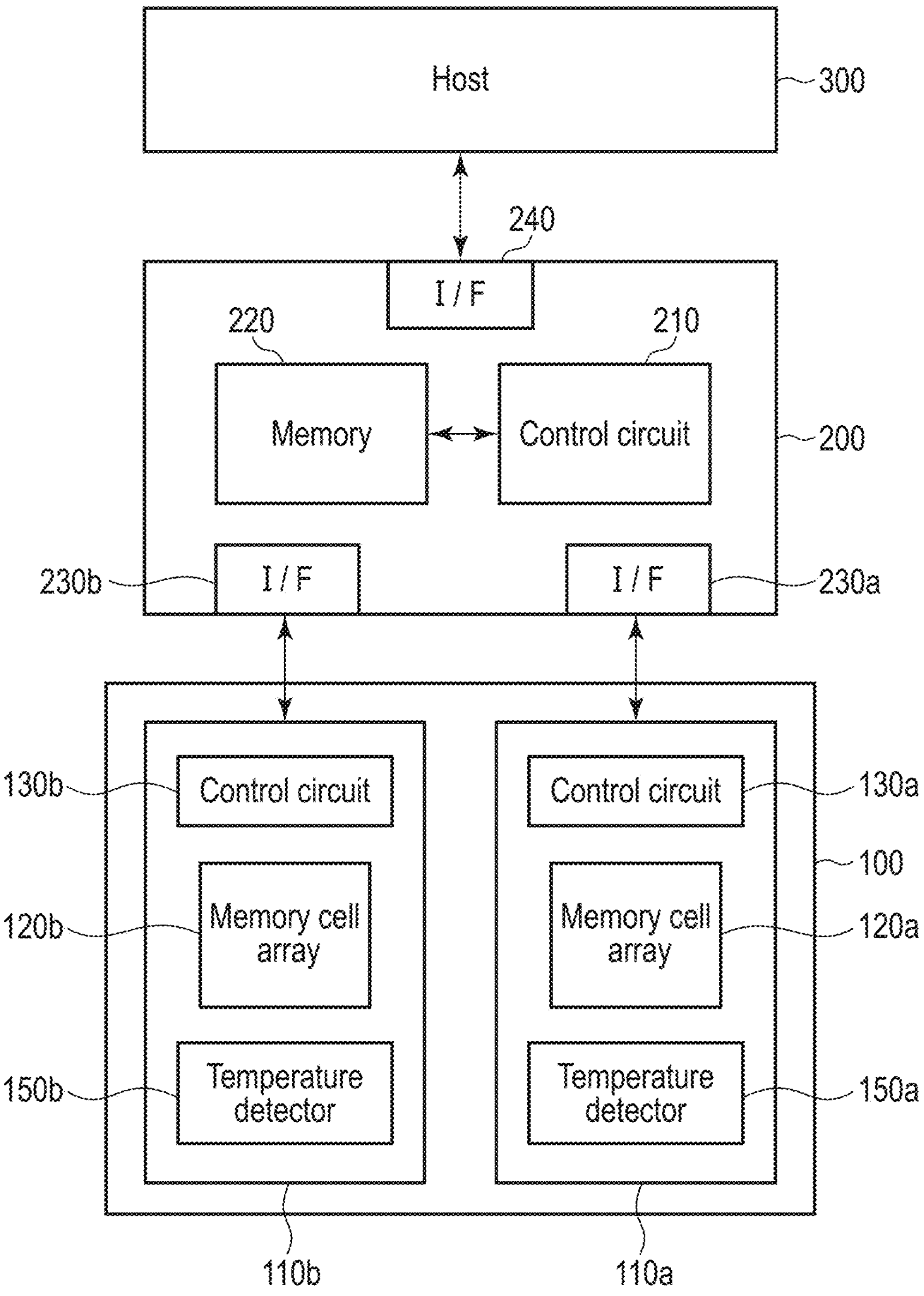
FIG. 12 is a block diagram showing the fundamental configuration of a memory system according to a second embodiment.

FIG. 12 is a block diagram showing the fundamental configuration of a memory system according to a second embodiment.

The fundamental configuration of the memory system shown in FIG. 12 is identical to the configuration shown in FIG. 1 of the first embodiment. In this embodiment, temperature detectors 150*a* and 150*b* are respectively provided in the submemory units 110*a* and 110*b* and the temperature detectors 150*a* and 150*b* are respectively configured to enable detection of the temperatures (ambient temperature) around the memory cell arrays 120*a* and 120*b*.

It should be noted that as in the case of the first embodiment, in the following description, in some cases, each of the submemory units 110*a* and 110*b* is expressed as a submemory unit 110, each of the memory cell arrays 120*a* and 120*b* is expressed as a memory cell array 120, each of the control circuits 130*a* and 130*b* is expressed as a control circuit 130, and each of the temperature detectors 150*a* and 150*b* is expressed as a temperature detector 150.

Further, although in the example shown in FIG. 12, the temperature detectors 150*a* and 150*b* are respectively provided in the submemory units 110*a* and 110*b*, one temperature detector 150 may be shared by the submemory units 110*a* and 110*b*. That is, one temperature detector 150 is provided in the memory unit 100 and the one temperature detector 150 may be shared by the plurality of submemory units 110. Furthermore, in the case of a memory system in which the memory unit 100 and controller 200 are provided in one package, it is sufficient if the temperature detector 150 is provided inside the memory system even if the temperature detector 150 is not provided in the memory unit 100.

Figure 13:
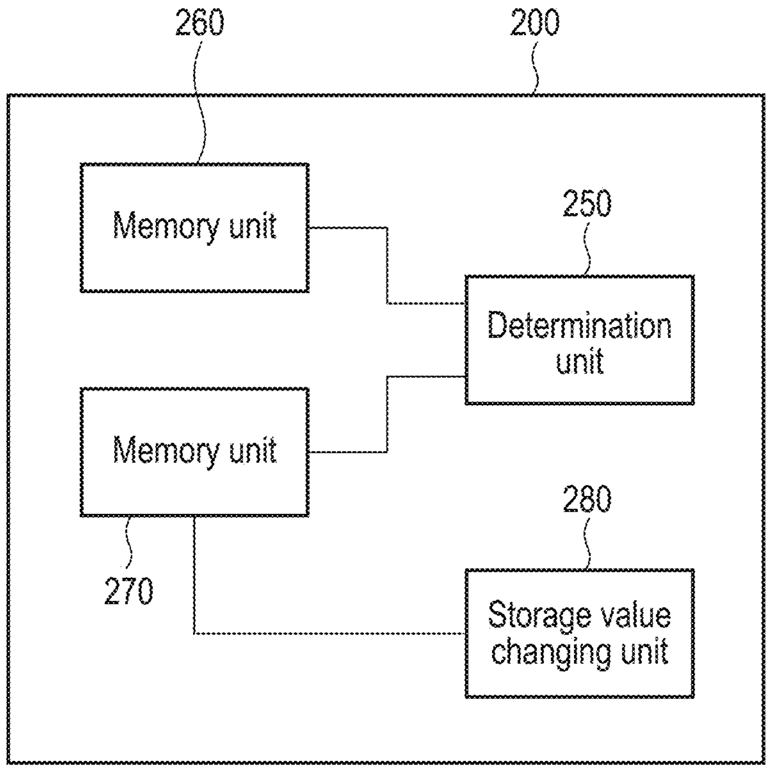
FIG. 13 is a functional block diagram showing the functional configuration of a controller according to the second embodiment.

FIG. 13 is a functional block diagram showing the functional configuration of the controller 200 in this embodiment.

The fundamental functional configuration of the controller 200 shown in FIG. 13 is identical to the functional configuration shown in FIG. 8 of the first embodiment. In this embodiment, a storage value changing unit 280 is provided in the controller 200. The storage value changing unit 280 changes the second value stored in the memory unit 270 according to the temperature around each of the one or more memory cell arrays 120. Hereinafter, a description of the above will be given.

The characteristics and reliability (for example, read disturb probability and breakdown percent defective of the tunnel barrier layer) of the memory cell 30 are normally dependent on the temperature (in particular, temperature of the magnetoresistance effect element 40) of the memory cell 30. For example, the read disturb probability is generally aggravated when the temperature of the memory cell 30 becomes higher. Further, the reliability of the memory cell 30 changes according to the temperature dependence of the write current Ic. That is, regarding the characteristics and reliability of the memory cell 30, there is a case where the characteristics and reliability are aggravated when the temperature becomes higher and there is also a case where the characteristics and reliability are aggravated when the temperature becomes lower.

In this embodiment, on the basis of the temperature dependence of the characteristics and reliability of the memory cell 30 and according to the temperature (ambient temperature) around the memory cell array 120 detected by the temperature detector 150, the second value of each of the plurality of memory cell blocks BLK stored in the memory unit 270 is changed.

More specifically, the second value stored in the memory unit 270 is changed according to the temperature (ambient temperature) around the memory cell array 120 in such a manner as to change the rate (increase rate or decrease rate) at which the allowable number of times of the predetermined access increases or decreases according to the distance from the drive circuit 140.

For example, when the characteristics and reliability of the memory cell 30 are aggravated at the time of a high temperature, the second value is changed in such a manner that the rate at which the allowable number of times of the predetermined access increases or decreases according to the distance from the drive circuit 140 becomes greater at the time of a high temperature than at the time of a low temperature. Conversely, when the characteristics and reliability of the memory cell 30 are aggravated at the time of a low temperature, the second value is changed in such a manner that the rate at which the allowable number of times of the predetermined access increases or decreases according to the distance from the drive circuit 140 becomes greater at the time of a low temperature than at the time of a high temperature.

In this embodiment too, the fundamental configuration and fundamental control method are identical to the first embodiment and, in this embodiment too, it is possible to obtain the effect identical to the first embodiment. Further, by carrying out the control described above, the rate at which the number of times of the predetermined access increases or decreases according to the distance from the drive circuit 140 is effectively changed in accordance with the temperature around the memory cell array 120, i.e., in accordance with the temperature of the usage environment, and it is possible to effectively prolong the lifetime of the entirety of the memory unit 100.

It should be noted that although in the first and second embodiments described above, a magnetoresistance effect element is used as the resistance change memory element, other resistance change memory elements may also be used.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:

a memory unit including a memory cell array which includes a plurality of memory cells and which is divided into a plurality of memory cell blocks, and a drive circuit which drives the plurality of memory cells; and a controller which controls the memory unit, wherein each of the plurality of memory cells includes a resistance change memory element and a switching element connected in series to the resistance change memory element, and the controller is configured to control the memory unit in such a manner that the number of times of predetermined access to each of the plurality of memory cell blocks increases or decreases according to a distance from the drive circuit to each of the plurality of memory cell blocks.

2. The memory system of claim 1, wherein the controller is configured to:

store a first value based on the number of times of the predetermined access made to each of the plurality of memory cell blocks with respect to each of the plurality of memory cell blocks, store a second value based on the allowable number of times of the predetermined access to each of the plurality of memory cell blocks with respect to each of the plurality of memory cell blocks, and determine a memory cell block to which data should be written out of the plurality of memory cell blocks on the basis of the first value and the second value stored with respect to each of the plurality of memory cell blocks.

3. The memory system of claim 2, wherein the allowable number of times of the predetermined access to each of the plurality of memory cell blocks increases or decreases according to the distance from the drive circuit.

4. The memory system of claim 1, wherein the plurality of memory cells included in the memory cell array are arranged in a first direction and in a second direction intersecting the first direction, and the drive circuit includes a first drive circuit provided along an end of the memory cell array in the first direction and a second drive circuit provided along an end of the memory cell array in the second direction.

5. The memory system of claim 4, wherein the distance from the drive circuit corresponds to a total distance of a first distance from the first drive circuit and a second distance from the second drive circuit.

6. The memory system of claim 4, wherein the distance from the drive circuit corresponds to a shorter distance of a first distance from the first drive circuit and a second distance from the second drive circuit.

7. The memory system of claim 1, further comprising a temperature detector which detects a temperature around the memory cell array.

8. The memory system of claim 7, wherein the controller is configured to change, in accordance with the temperature around the memory cell array, a rate at which the number of times of the predetermined access increases or decreases according to the distance from the drive circuit.

9. The memory system of claim 1, wherein the predetermined access corresponds to at least one of write access and read access.

10. The memory system of claim 1, wherein the resistance change memory element and the switching element included in each of the plurality of memory cells are stacked.

11. The memory system of claim 1, wherein the resistance change memory element is a magnetoresistance effect element.

* * * * *